(12) United States Patent
Chen

(10) Patent No.: US 6,746,879 B1
(45) Date of Patent: Jun. 8, 2004

(54) GUARD FILTER METHODOLOGY AND AUTOMATION SYSTEM TO AVOID SCRAP DUE TO RETICLE ERRORS

(75) Inventor: Cheng-I Chen, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 91 days.

(21) Appl. No.: 10/262,905

(22) Filed: Oct. 2, 2002

(51) Int. Cl.⁷ .......................... H01L 21/00; G06F 19/00
(52) U.S. Cl. ........................................... 438/5; 700/121
(58) Field of Search ............................... 438/5; 700/121

(56) References Cited

U.S. PATENT DOCUMENTS

| | | | |
|---|---|---|---|
| 4,974,166 A | 11/1990 | Maney et al. | 364/478 |
| 5,191,535 A * | 3/1993 | Terao | 700/121 |
| 5,528,510 A | 6/1996 | Kraft | 364/468 |
| 5,740,052 A * | 4/1998 | Nakamura | 700/121 |
| 6,256,550 B1 | 7/2001 | Wu et al. | 700/121 |
| 6,309,944 B1 | 10/2001 | Sheng et al. | 438/401 |
| 6,363,296 B1 * | 3/2002 | Schulze | 700/125 |
| 6,658,641 B2 * | 12/2003 | Ashida et al. | 716/21 |

* cited by examiner

Primary Examiner—Kamand Cuneo
Assistant Examiner—Scott B. Geyer
(74) Attorney, Agent, or Firm—George O. Saile; Stephen B. Ackerman

(57) ABSTRACT

A guard filter methodology that automatically controls mask screening with the result of improved wafer quality, less scrap, and improved productivity. Upon each assignment of the mask or reticle to a specific piece of equipment, it provides a trigger to automatically check pertinent aspects of a mask related to wafer quality and yield with a guard filter system in combination with a database. The system is integrated into the current manufacturing machine control system and performs its checks quickly and efficiently. Wafer scrap due to the use of wrong scale mask for the specified equipment or a mask that is not usable are avoided. This automated guard filter methodology reduces manufacturing time and cost, checking frequency, and human error.

32 Claims, 4 Drawing Sheets

FIG. 1 - Prior Art

GUARD FILTER METHODOLOGY AND AUTOMATION SYSTEM TO AVOID SCRAP DUE TO RETICLE ERRORS

BACKGROUND OF THE INVENTION

1. Field of Invention

This invention relates generally to integrated circuit (IC) manufacturing using exposed silicon substrates on wafer and, more particularly, to the quality, status, and appropriateness of reticle (mask) during the complicated process of IC development.

2. Description of Related Art

In IC manufacturing, the mask (sometimes called the reticle) is used for exposing silicon substrates on a wafer. This mask in combination with complex photographic equipment plays an important role in the semiconductor IC manufacturing process. Wafer quality and yields are impacted by the mask's status and quality during the complex wafer-build process. Specifically, the mask's Piece Of Data (POD) which contains its precise image must be kept without defect and in clean condition, so that the quality of the wafer is not compromised.

Ideally, tool operators thoroughly check the status and quality of the mask as well as making sure the mask is the appropriate one for the specific equipment before assigning the mask to the equipment in an attempt to avoid wafer scrap and reduced yields (These are very costly to the manufacturing process and hinder the overall productivity of the entire wafer-build process.). This manual checking of the mask upon each assigning is time consuming, inefficient, and expensive, and the check itself can lead to mask damage.

Currently, there are several different scales of reticle (ex. 2X, 4X, 8X, etc.) in use in FABS. It is important to assign the correct scale and pellicle for the specific machine (match of capabilities) to avoid wafer scrap. Unfortunately, it is very hard to visually differentiate between the different scales as their appearance is very similar. Because of this, a tool operator might mistakenly manually assign the wrong scale mask to the equipment which undetected leads to scrap.

A new automated method and system to more efficiently reduce reticle errors and avoid scrap in a cost-effective way is required. A process to automatically check to make sure pre-defined mask criteria (including usability, appropriateness of scale for assigned equipment, and last clean time of the POD) are met before allowing the mask to be loaded into the equipment is needed.

In U.S. Pat. No. 6,309,944 (Sheng et al.) an overlay matching method that provides alignment of layers of wafers is discussed. In U.S. Pat. No. 6,256,550 (Wu et al.) a manufacturing control method and system for handling semiconductor articles is discussed. In U.S. Pat. No. 5,528,510 (Kraft) a process control system and method using a tuned model control is discussed. In U.S. Pat. No. 4,974,166 (Maney et al.) a system for storing, transporting, and processing semiconductor articles is discussed.

SUMMARY OF THE INVENTION

This invention's overall objective is to provide a software system and method for the automatic control of mask screening for usability and correctness of reticle scale for the specific equipment with the result of improved wafer quality and less scrap. A more specific objective is for a mask to be assigned to the equipment. Another objective is to provide a database in which to store the mask's parameters. Still another objective is to define the automatic checking criteria for the mask's parameters for comparison in the database.

Yet another specific objective is to provide a trigger function that automatically begins the checking of the mask. It is a final objective to allow loading of the mask into the equipment only when the set of parameter checks have been satisfactorily met.

BRIEF DESCRIPTION OF THE DRAWINGS

This invention will be described with reference to the accompanying drawings, wherein.

DETAILED DESCRIPTION OF THE PREFERRED EMBODIMENT

Mask or reticle quality is a critical part of the manufacture of IC wafers. The mask is used for exposing silicon substrates on the wafer. This physical mask is like a photographic plate. Once it is made, it is subject to handling problems just like any negative. Since the mask contains all the precise details of the wafer layout, any defect or flaw that is added from improper handling can cause wafers made from it to be scraped and chip yield to be low. Additionally, the size and shape of different-scale masks appear much the same. This makes it very difficult for the operator to be sure that the correct mask scale and pellicle that matches the equipment has been assigned. Using a wrong-scale and pellicle mask incompatible with the equipment will again cause the wafers to be scraped.

Figure 1:
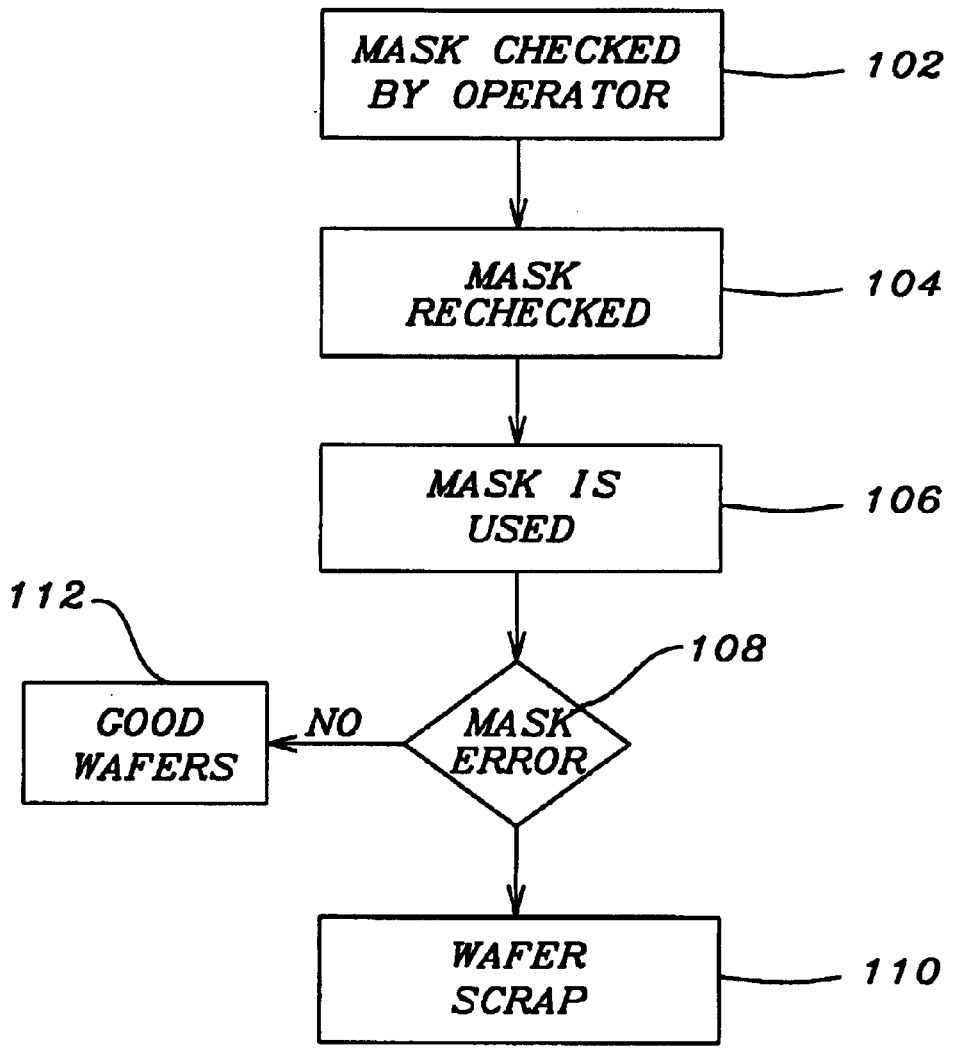
FIG. 1 is a flow diagram of prior art mask checking.

In the prior art method, operators spend significant time checking and double checking the mask before assigning it to the tool to prevent mask problems. FIG. 1 shows the prior art method. The mask to be used is Checked By the Operator 102 as each mask is assigned. This is a manual check of the mask itself The use of a wrong-scale reticle would be difficult to detect because of the similar physical appearance of different mask scales. Even a Mask Re-check 104 might not eliminate all mask problems. All checks completed, the Mask is Used 106 in the tool to produce the wafers. Wafers are then finished and tested for errors. If a Mask Error 108 is found, the wafers become Scrap 110 and are disposed of resulting in a reduced yield of chips and increased manufacturing costs. If no mask error occurred then Good Wafers 112 are the ideal outcome.

Figure 2:
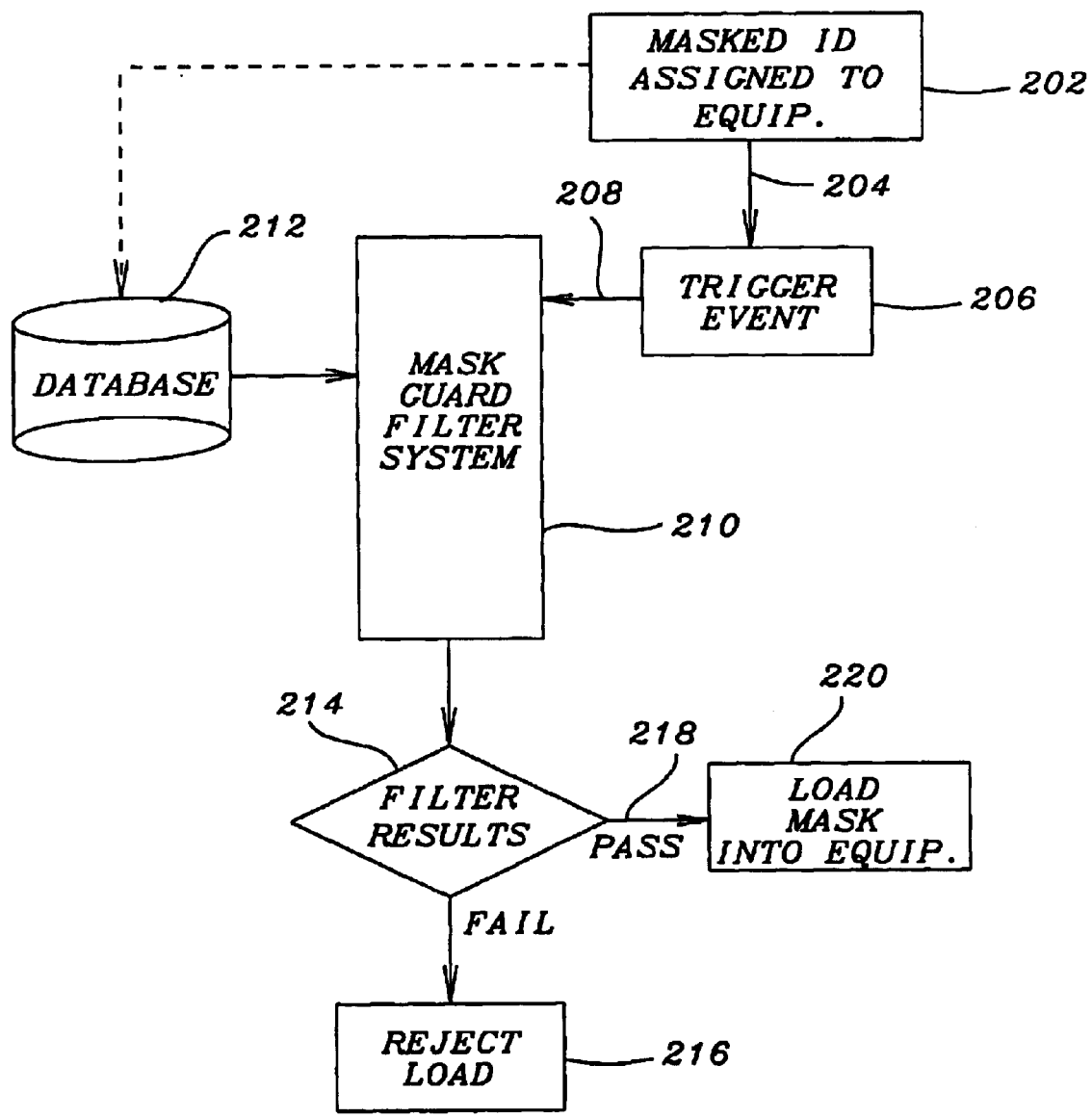
FIG. 2 is a flow diagram of the mask guard filter method and system architecture.

A better method is needed to reduce the wafer scrap and the lower yield caused by mask not being usable. The method and system of this invention solves these problems by introducing a guard filter methodology and an automated system to screen for usability. FIG. 2. shows the system architecture of the invention. This is a data processing method and system that stores the mask's parameters or information in a database and compares it against defined automatic checking criteria. This data input and reading is accomplished by simple computer entry into the database of a software system that is integrated as part of the equipment automation system used to control tools on the manufacturing floor and by placing a machine-readable identifier on each mask. As in FIG. 2 the first thing done to a newly created mask is that a Mask with ID (containing identifier) is manually assigned to the equipment 202. This ID is unique and reticle-related information such as status, grade, last check time, check result, clean time, scale, and the specific equipment type it can be used on is stored under this identifier in the Database 212. The Database 212 also contains a mapping table with information as to which mask scale and pellicle are appropriate for a specific equipment type and constraint table with maximum allowable constraint conditions such as time.

After an operator has picked up the mask and assigned it to the equipment 204, a Trigger Event 206 is caused in the existing Equipment Automation System (EQS). All tools are tied to this system already. The EQS now reads the mask ID and Passes 208 this to the Mask Guard Filter System (MGFS) 210. This software system is integrated into the EQS and provides the methodology of this invention. The MGFS then reads the Database 212 and obtains the latest information on the mask. If all comparison Filter Results 214 are positive for use on the equipment at that time, then the mask is Passed 218 and the tools will Load the Mask 220. If one of the parameters does not properly match, the MGFS will send a Fail and Reject Load 216 to the EQS that prevents the mask from being loaded.

Figure 3:
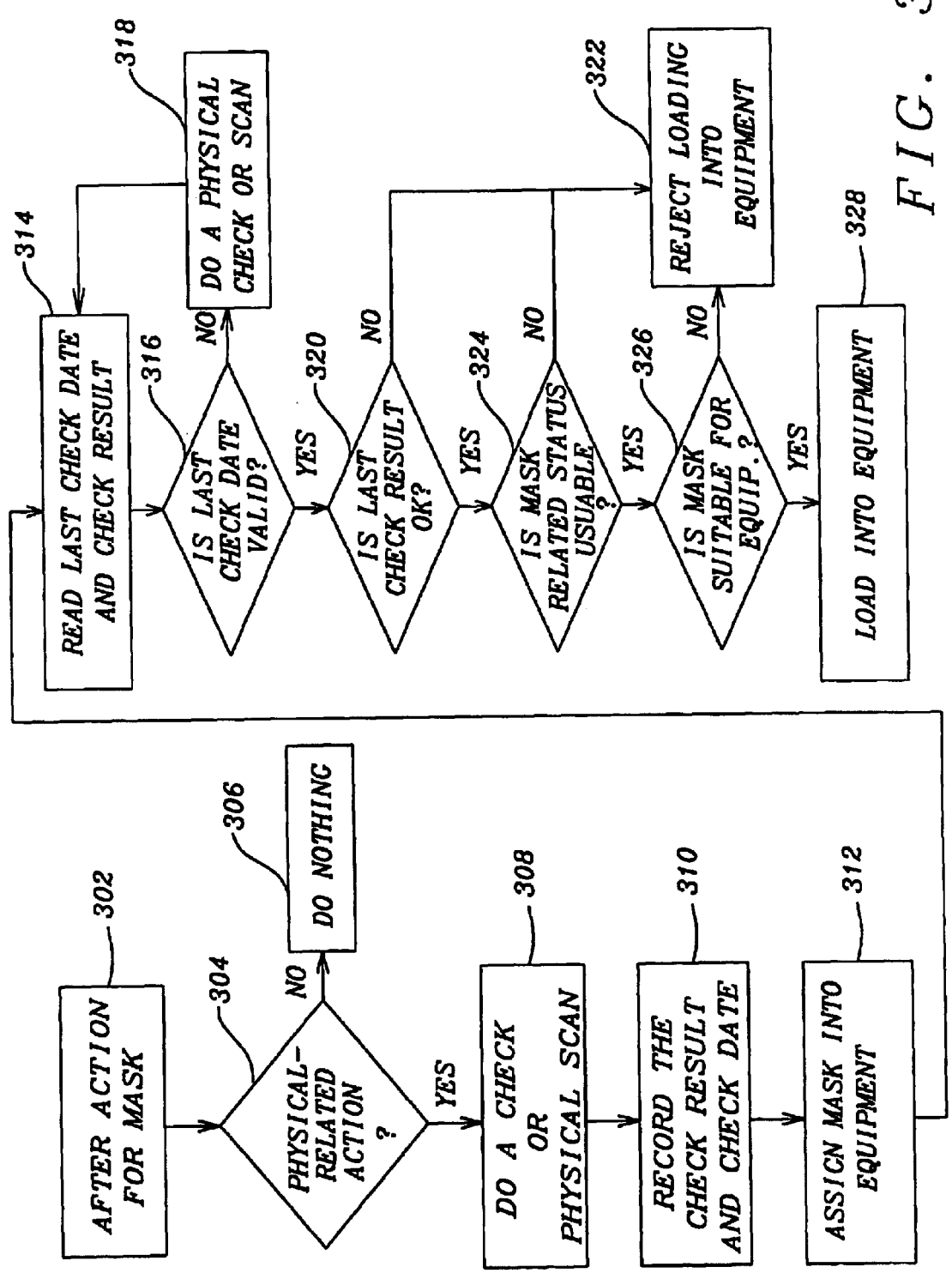
FIG. 3 is a flow diagram of the checking methodology.

FIG. 3 looks at the checking methodology of the MGFS in more detail. An action for mask 302 has occurred. A determination is then made if the action (ex. using the mask to expose wafers) is a physical-related action 304. If it is not a physical-related action, nothing needs to be done 306. If it is a physical-related action 304, a check or physical scan 308 of the mask is called for and the results of the scan and the check date are recorded 310 in the database.

Each time a mask is assigned to the equipment 312, the filter system 313 is automatically triggered to read the last check date and check result 314 record from the database to ascertain that the mask is usable and that the physical check falls within the maximum valid period 316 according to a constraint table in the database. If it has been too long since the last check or scan, the MGFS will request that the EQS do a physical check or scan 318 to make sure the mask's status, grade, and condition assures its usability before the mask is loaded into the equipment. If the date is valid, then the MGFS checks to see if the last check result was OK 320. If not, the MGFS rejects the loading into the equipment 322. If the last check was OK 320, then the MGFS checks to see if the related status of the mask is usable 324. For example, the status could be hold for engineers or repair. If the mask status is not usable, again the MGFS rejects loading the mask into the equipment 322. If the mask status is usable, then a check is made to see if the mask is suitable for the equipment 326 (appropriate mask scale and pellicle for the equipment type). If it is not suitable, the MGFS rejects the loading of the mask into the equipment 322. If it is suitable, only then is it permitted to be loaded into the equipment 328.

It is important to point out that all these checks are done rapidly by the MGFS. They are all based on the check results and information recorded into the database. Thus, as masks are handled numerous times throughout the day by operators, fast checking is done at each mask assigning into the equipment. Operators get immediate feedback on the quality of the present mask and are prevented from using a mask that does not meet the criteria of the system. Only relevant physical parameters are checked including whether there has been a check completed within a valid specified time period.

Figure 4:
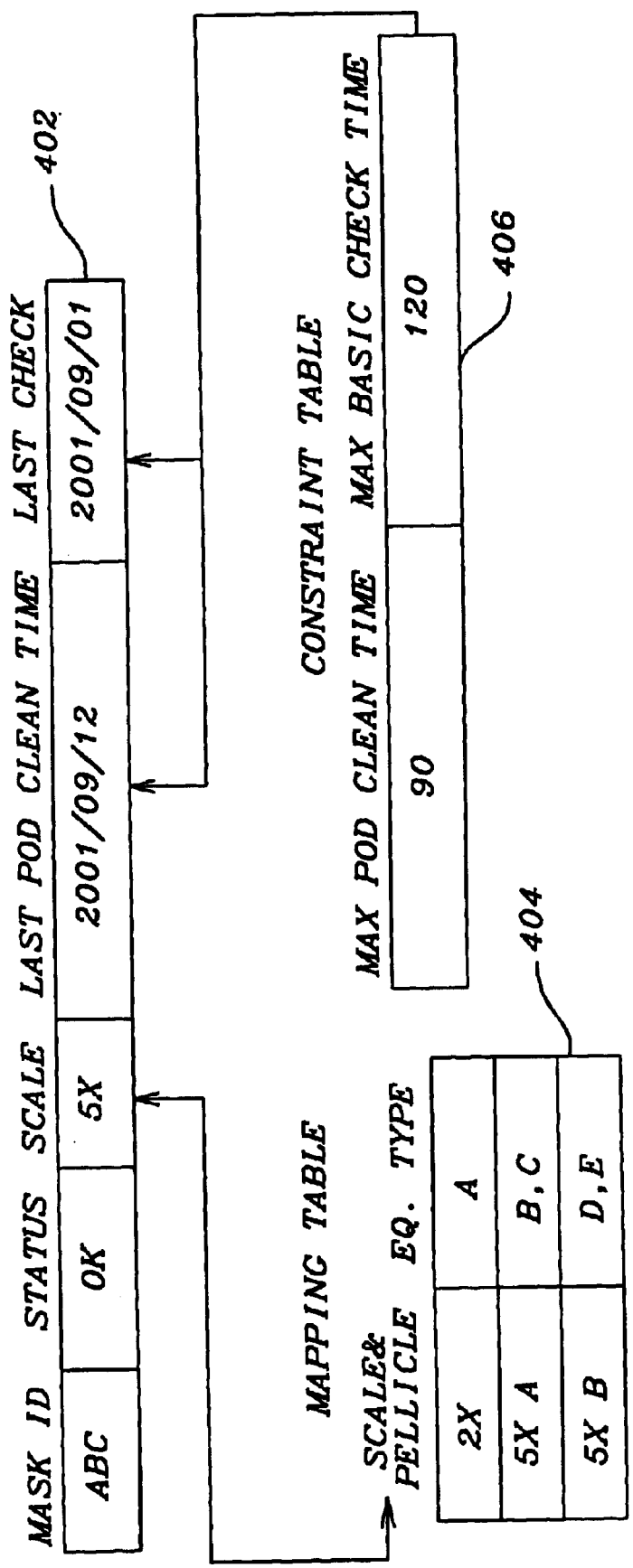
FIG. 4 is a example of the table data used by the system.

In FIG. 4 is an illustration of basic tables containing related-mask information, scale and pellicle/equipment compatibility, and time-constraint conditions that are stored in the database that the MGFS creates and uses for checks. The Mask ID is that which has been assigned and can be read as a bar code or a tag physically on the mask. The Status is the current status of the mask, such as OK, needs repair, or save for engineer. The Scale is the scale of the current mask which is checked with a Mapping Table 404 to see what specific equipment types it is compatible with to make sure it is appropriate for the assigned equipment. The Last POD Clean Time is the date the Piece of Data was last cleaned which was recorded in a tag or bar code label or stored in the database and then compared with a Constraint Table 406 to make sure the clean time falls within the pre-defined time constraint or maximum valid period. Last Check indicates the date of the last check and it, too, is compared with the maximum valid mask check time found in the Constraint Table 406. The mask or reticle is loaded into the equipment only when the entire set of parameter checks are satisfactorily met.

The method of the invention provides advantages over the prior art including a trigger for automatic filtering (checking) resulting in improved quality assurance of mask, precluding of wrong-scale mask assigning, and reduced errors and scrap. It also greatly reduces the mask physical-checking frequency for improved productivity and savings of manufacturing time and money, and the mask can not be loaded into the equipment until the entire set of parameter checks have satisfactorily been met.

While the invention has been particularly shown and described with reference to preferred embodiments thereof, it will be understood by those skilled in the art that various changes in form and details may be made without departing from the spirit and scope of the invention.

What is claimed is:

1. A method to automatically control mask screening to improve wafer quality, comprising:
   a. assigning said mask to equipment;
   b. providing a database to store said mask's parameters;
   c. defining automatic checking criteria for said mask's parameters for comparison in said database;
   d. providing an automatic trigger function to begin said automatic checking, and
   e. loading of said mask into said equipment only when the set of parameter checks are satisfactorily met.

2. The method to automatically control mask screening of claim 1, wherein said mask containing identifier can be manually assigned to said equipment causing said automatic trigger function to start the check of said mask's said set of parameters before final assignment.

3. The method to automatically control mask screening of claim 2, wherein said parameters include mask's identifier, status, grade, last check time, check result, clean time, scale, and specific equipment type it can be used on.

4. The method to automatically control mask screening of claim 2, wherein a guard filter methodology does said automatic checking of said mask's parameters in combination with said database.

5. The method to automatically control mask screening of claim 4, wherein said database contains reticle-related information, mapping table, and time-constraint conditions.

6. The method to automatically control mask screening of claim 5, wherein said mapping table contains information as to which mask scale and pellicle are appropriate for said specific equipment type.

7. The method to automatically control mask screening of claim 4, wherein said guard filter methodology is a software system that is integrated as part of the equipment automation system used to control tools on the manufacturing floor.

8. The method to automatically control mask screening of claim 4, wherein said guard filter methodology ensures that said mask said clean time falls within defined time constraint before permitting said loading into said equipment.

9. The method to automatically control mask screening of claim 8, wherein said clean time of said mask's piece of data is recorded in a tag or bar code label or stored in said database after the said mask's piece of data is washed.

10. The method to automatically control mask screening of claim 4, wherein said guard filter methodology ensures that said mask scale matches said equipment before permitting said loading into said equipment.

11. The method to automatically control mask screening of claim 4, wherein said guard filter methodology checks said mask's status, grade, and its condition to assure its usability before permitting said loading into said equipment.

12. The method to automatically control mask screening of claim 11, wherein said mask is physically checked or scanned for said usability only after some special, physically-related action has been taken on said mask rather than doing it after each said assigning.

13. The method to automatically control mask screening of claim 12, wherein the result and time of the physical check is recorded in said database.

14. The method to automatically control mask screening of claim 12, wherein a maximum valid period for said physical check is defined in a constraint table in said database.

15. The method to automatically control mask screening of claim 12, wherein said guard filter methodology checks the last check result and said time to ascertain that said mask is usable and that said physical check falls within said maximum valid period before permitting said loading into said equipment.

16. The method to automatically control mask screening of claim 1, wherein said automatic trigger function is invoked each time said mask is assigned to said equipment.

17. A system to automatically control mask screening to improve wafer quality, comprising of:
   a. a means to assign said mask to equipment;
   b. a means to provide a database to store said mask's parameters;
   c. a means to define automatic checking criteria for said mask's parameters for comparison in said database;
   d. a means to provide an automatic trigger function to begin said automatic checking, and
   e. a means to control the loading of said mask into said equipment only when the set of parameter checks are satisfactorily met.

18. The system to automatically control mask screening of claim 17, wherein said mask containing identifier can be manually assigned to said equipment causing said automatic trigger function to start the check of said mask's said set of parameters before final assignment.

19. The system to automatically control mask screening of claim 18, wherein said parameters include mask's identifier, status, grade, last check time, check result, clean time, scale, and specific equipment type it can be used on.

20. The system to automatically control mask screening of claim 18, wherein a guard filter methodology does said automatic checking of said mask's parameters in combination with said database.

21. The system to automatically control mask screening of claim 20, wherein said database contains reticle-related information, mapping table, and time-constraint conditions.

22. The system to automatically control mask screening of claim 21, wherein said mapping table contains information as to which mask scale and pellicle are appropriate for said specific equipment type.

23. The system to automatically control mask screening of claim 20, wherein said guard filter methodology is a software system that is integrated as part of the equipment automation system used to control tools on the manufacturing floor.

24. The system to automatically control mask screening of claim 23, wherein said guard filter methodology ensures that said clean time falls within defined time constraint before permitting said loading into said equipment.

25. The system to automatically control mask screening of claim 24, wherein said clean time of said mask's piece of data is recorded in a tag or bar code label or stored in said database after the said mask's piece of data is washed.

26. The system to automatically control mask screening of claim 20, wherein said guard filter methodology ensures that said mask scale matches said equipment before permitting said loading into said equipment.

27. The system to automatically control mask screening of claim 20, wherein said guard filter methodology checks the said mask's status, grade, and its condition to assure its usability before permitting said loading into said equipment.

28. The system to automatically control mask screening of claim 27, wherein said mask is physically checked or scanned for said usability only after some special, physically-related action has been taken on said mask rather than doing it after each said assigning.

29. The system to automatically control mask screening of claim 27, wherein the result and time of the physical check is recorded in said database.

30. The system to automatically control mask screening of claim 27, wherein a maximum valid period for said physical check is defined in a constraint table in said database.

31. The system to automatically control mask screening of claim 27, wherein said guard filter methodology checks the last check result and said time to ascertain that said mask is usable and that said physical check falls within said maximum valid period before permitting said loading into said equipment.

32. The system to automatically control mask screening of claim 17, wherein said automatic trigger functions is invoked each time said mask is assigned to said equipment.

* * * * *